(12) United States Patent
Höppel

(10) Patent No.: US 9,000,476 B2
(45) Date of Patent: Apr. 7, 2015

(54) OPTOELECTRONIC COMPONENT

(75) Inventor: Lutz Höppel, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 164 days.

(21) Appl. No.: 13/810,335

(22) PCT Filed: May 25, 2011

(86) PCT No.: PCT/EP2011/058573
§ 371 (c)(1),
(2), (4) Date: Mar. 12, 2013

(87) PCT Pub. No.: WO2012/010352
PCT Pub. Date: Jan. 26, 2012

(65) Prior Publication Data
US 2013/0207154 A1    Aug. 15, 2013

(30) Foreign Application Priority Data

Jul. 20, 2010    (DE) .......................... 10 2010 027 679

(51) Int. Cl.
| | |
|---|---|
| H01L 33/00 | (2010.01) |
| H01L 33/62 | (2010.01) |
| H01L 25/16 | (2006.01) |
| H01L 33/22 | (2010.01) |
| H01L 33/38 | (2010.01) |

(52) U.S. Cl.
CPC .............. *H01L 33/62* (2013.01); *H01L 25/167* (2013.01); *H01L 33/22* (2013.01); *H01L 33/38* (2013.01); *H01L 2924/0002* (2013.01)

(58) Field of Classification Search
USPC ......................................... 257/99, 98; 438/29
See application file for complete search history.

(56) References Cited

U.S. PATENT DOCUMENTS 5,760,398 A    6/1998    Blackwell
6,445,011 B1   9/2002    Hirano et al.
(Continued)

FOREIGN PATENT DOCUMENTS

CN    101101944    1/2008
CN    101345235    1/2009
(Continued)

OTHER PUBLICATIONS

Abelmann, L. et al., "Oblique Evaporation and Surface Diffusion," *Thin Solid Films*, 1997, vol. 305, pp. 1-21.
(Continued)

*Primary Examiner* — Errol Fernandes
(74) *Attorney, Agent, or Firm* — DLA Piper LLP (US)

(57) ABSTRACT

An optoelectronic component has a semiconductor body including an epitaxial layer sequence, and a carrier substrate consisting of a semiconductor material connected to the semiconductor body by a solder layer, and through-connections. The carrier substrate includes a surface doping zone extending along a first main surface facing the semiconductor body. The surface doping zone includes a p-conductive region and an n-conductive region adjacent thereto, between which regions a pn-junction is formed. The n-conductive region electrically connects to a p-doped region of the epitaxial layer sequence via a first sub-region of the solder layer, and the p-conductive region electrically connects to an n-doped region of the epitaxial layer sequence via a second sub-region of the solder layer.

20 Claims, 2 Drawing Sheets

(56) References Cited

U.S. PATENT DOCUMENTS

| | | |
|---|---|---|
| 6,531,328 B1 | 3/2003 | Chen |
| 6,696,704 B1 | 2/2004 | Maeda et al. |
| 7,268,371 B2 | 9/2007 | Krames et al. |
| 7,410,908 B2 | 8/2008 | Hara |
| 7,446,344 B2 | 11/2008 | Fehrer et al. |
| 7,738,764 B2 | 6/2010 | Kim |
| 7,977,688 B2 | 7/2011 | Kim |
| 2001/0045619 A1 | 11/2001 | Dekker et al. |
| 2003/0141496 A1 | 7/2003 | Illek et al. |
| 2005/0003565 A1 | 1/2005 | Eisert et al. |
| 2006/0056123 A1 | 3/2006 | Aoyagi et al. |
| 2007/0102654 A1 | 5/2007 | Schoo |
| 2007/0170445 A1 | 7/2007 | Furukawa et al. |
| 2008/0142817 A1 | 6/2008 | Ibbetson et al. |
| 2008/0176353 A1 | 7/2008 | Sugawara et al. |
| 2008/0290353 A1 | 11/2008 | Medendorp, Jr. et al. |
| 2008/0308823 A1 | 12/2008 | Kamii et al. |
| 2009/0101897 A1 | 4/2009 | Murphy et al. |
| 2009/0173963 A1 | 7/2009 | Hsu et al. |
| 2009/0315048 A1 | 12/2009 | Fehrer et al. |
| 2010/0133568 A1* | 6/2010 | Komatsu et al. ............... 257/98 |
| 2010/0171135 A1 | 7/2010 | Engl et al. |
| 2011/0211604 A1 | 9/2011 | Roscher |
| 2011/0254046 A1 | 10/2011 | Hsu et al. |

FOREIGN PATENT DOCUMENTS

| | | |
|---|---|---|
| CN | 101375421 | 2/2009 |
| CN | 101395725 | 3/2009 |
| DE | 10 2007 022 947 A1 | 10/2008 |
| DE | 10 2008 034 560 A1 | 2/2010 |
| DE | 10 2009 013 085 A1 | 9/2010 |
| DE | 10 2009 032 486 A1 | 1/2011 |
| EP | 1 020 935 A2 | 7/2000 |
| EP | 1 826 834 A2 | 8/2007 |
| EP | 2 194 588 A2 | 6/2010 |
| WO | 95/22842 A1 | 8/1995 |
| WO | 2005/048363 A2 | 5/2005 |
| WO | 2006/054616 A1 | 5/2006 |
| WO | 2007/085218 | 8/2007 |
| WO | 2008/131735 A1 | 11/2008 |
| WO | 2011/003907 A1 | 1/2011 |

OTHER PUBLICATIONS

English translation of the Notification of the First Office Action of Patent Application No. CN 201080021372.2 dated Jul. 16, 2013.
Notification of the First Office Action of CN Application No. 201180035714.0 dated Dec. 1, 2014.

* cited by examiner

OPTOELECTRONIC COMPONENT

RELATED APPLICATIONS

This is a §371 of International Application No. PCT/EP2011/058573, with an international filing date of May 25, 2011 (WO 2012/010352 A1, published Jan. 26, 2012), which is based on German Patent Application No. 10 2010 027 679.0, filed Jul. 20, 2010, the subject matter of which is incorporated herein by reference.

TECHNICAL FIELD

This disclosure relates to an optoelectronic component which comprises a semiconductor body and a carrier substrate connected to the semiconductor body by a solder layer.

BACKGROUND

There is a need for an improved optoelectronic component, wherein the semiconductor body is connected to a carrier substrate by a solder layer, wherein the optoelectronic component is characterized by low susceptibility to short circuits and/or electrostatic discharges (ESD) and can be produced in a comparatively simple manner.

SUMMARY

I provide an optoelectronic component having a semiconductor body including an epitaxial layer sequence having an active layer that generates radiation, and a carrier substrate consisting of a semiconductor material connected to the semiconductor body by a solder layer, wherein the carrier substrate includes a first through-connection and a second through-connection each of which extend from a first main surface of the carrier substrate facing the semiconductor body to a second main surface of the carrier substrate facing away from the semiconductor body, the epitaxial layer sequence includes a p-doped semiconductor region and an n-doped semiconductor region, wherein the first through-connection connects in an electrically conductive manner to the p-doped semiconductor region via a first sub-region of the solder layer, and the second through-connection connects in an electrically conductive manner to the n-doped semiconductor region via a second sub-region of the solder layer, the carrier substrate includes a surface doping zone which extends along the first main surface, the surface doping zone includes a p-conductive region which contains a p-dopant, the surface doping zone includes an n-conductive region adjacent to the p-conductive region and contains an n-dopant and a p-dopant so that a pn-junction is formed between the p-conductive region and the n-conductive region, the n-conductive region electrically connects to the first sub-region of the solder layer and the p-conductive region electrically connects to the second sub-region of the solder layer so that the pn-junction in the surface doping zone forms a protective diode for the semiconductor body.

I also provide an optoelectronic component having a semiconductor body including an epitaxial layer sequence having an active layer that generates radiation, and a carrier substrate consisting of a semiconductor material connected to the semiconductor body by a solder layer, wherein the carrier substrate includes a first through-connection and a second through-connection each of which extend from a first main surface of the carrier substrate facing the semiconductor body to a second main surface of the carrier substrate facing away from the semiconductor body, the epitaxial layer sequence includes a p-doped semiconductor region and an n-doped semiconductor region, wherein the first through-connection connects in an electrically conductive manner to the p-doped semiconductor region via a first sub-region of the solder layer, and the second through-connection connects in an electrically conductive manner to the n-doped semiconductor region via a second sub-region of the solder layer, the carrier substrate includes a surface doping zone extending along the first main surface, the surface doping zone includes a p-conductive region which contains a p-dopant, the surface doping zone includes an n-conductive region adjacent to the p-conductive region and contains an n-dopant and a p-dopant so that a pn-junction is formed between the p-conductive region and the n-conductive region, the n-conductive region is disposed as a ring around the first through-connection, the n-conductive region electrically connects to the first sub-region of the solder layer and the p-conductive region electrically connects to the second sub-region of the solder layer so that the pn-junction in the surface doping zone forms a protective diode for the semiconductor body.

DETAILED DESCRIPTION

Figure 1:
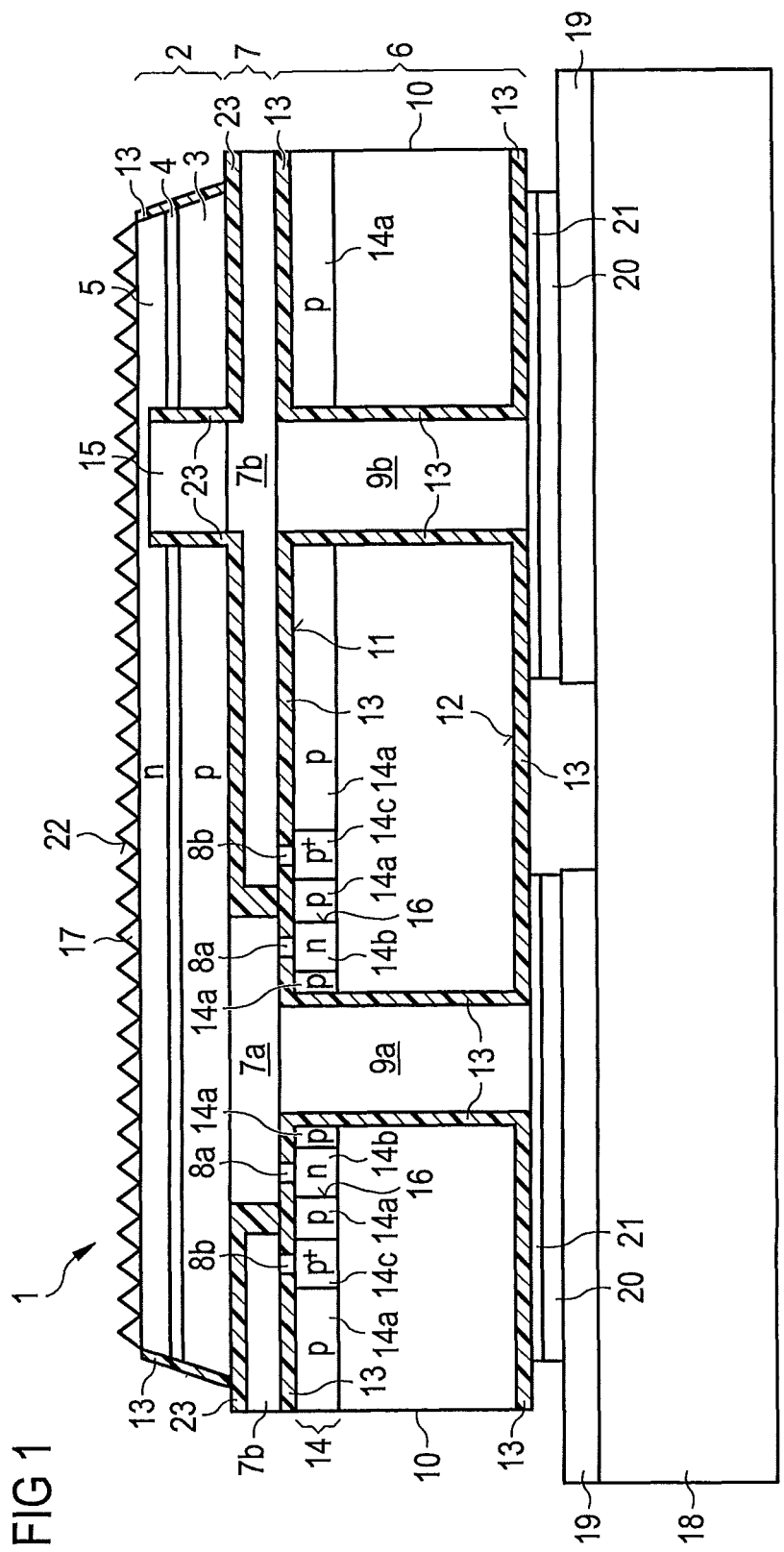
FIG. 1 shows a schematic illustration of a cross-section through an optoelectronic component in accordance with one example.

My optoelectronic component comprises a semiconductor body which comprises an epitaxial layer sequence having an active layer suitable for generating radiation. Furthermore, the optoelectronic component comprises a carrier substrate connected to the semiconductor body by a solder layer. The carrier substrate of the optoelectronic component is advantageously formed from a semiconductor material.

The carrier substrate advantageously comprises a first through-connection and a second through-connection each of which extend from a first main surface of the carrier substrate facing the semiconductor body to a second main surface of the carrier substrate facing away from the semiconductor body.

By virtue of the fact that the through-connections extend from the first main surface of the carrier substrate which is connected to the semiconductor body via the solder layer, to the opposing second main surface of the carrier substrate, the optoelectronic component can be advantageously provided with electrical connections on the second main surface of the carrier substrate. In particular, the optoelectronic component can be connected to conductor tracks of a printed circuit board on the second main surface of the carrier substrate in that, for example, the first through-connection connects to a first conductor track of a printed circuit board by a solder layer and the second through-connection connects to a second conductor track of the printed circuit board by a second solder layer. The optoelectronic component can thus be surface-mounted in an advantageous manner.

The epitaxial layer sequence advantageously comprises a p-doped semiconductor region and an n-doped semiconductor region, wherein the first through-connection connects in an electrically conductive manner to the p-doped semiconductor region via a first sub-region of the solder layer and the second through-connection connects in an electrically conductive manner to the n-doped semiconductor region via a second sub-region of the solder layer.

The carrier substrate advantageously comprises a surface doping zone which extends along the first main surface. The surface doping zone is thus disposed on the surface of the carrier substrate facing the semiconductor body.

The surface doping zone advantageously comprises a p-conductive region which contains a p-dopant. Furthermore, the surface doping zone comprises an n-conductive region adjacent to the p-conductive region so that a pn-junction is formed between the p-conductive region and the n-conductive region. The n-conductive region contains an n-dopant and also a p-dopant. The n-conductive region advantageously comprises the n-dopant at a higher concentration than the p-dopant which means that on the whole it is n-conductive.

The n-conductive region electrically connects to the first sub-region of the solder layer and the p-conductive region electrically connects to the second sub-region of the solder layer. Since the first sub-region of the solder layer connects to the p-doped semiconductor region in an electrically conductive manner and the second sub-region of the solder layer connects to the n-doped semiconductor region in an electrically conductive manner, the pn-junction in the surface doping zone forms a protective diode for the semiconductor body. The pn-junction in the surface doping zone thus connects anti-parallel to a pn-junction of the semiconductor body.

The protective diode formed in the surface doping zone protects the semiconductor body from electrostatic discharges. Voltage pulses in the reverse direction of the semiconductor body, triggered by electrostatic discharges, are diverted by a current flow through the pn-junction in the surface doping zone of the carrier substrate.

The surface doping zone is characterized in particular by virtue of the fact that it can be produced in a comparatively simple manner. The surface doping zone can be produced in particular by virtue of the fact that in a first step a p-dopant is diffused or implanted on the first main surface of the carrier substrate throughout the entire surface. In the finished optoelectronic component, the surface doping zone thus extends preferably along the entire main surface of the carrier substrate with the exception of the through-connections.

The n-conductive region can be produced in the surface doping zone by virtue of the fact that an n-dopant is implanted or diffused in a sub-region of the previously produced p-conductive region by a mask. The n-dopant is implanted or diffused such that the concentration of the n-dopant is greater than that of the p-dopant which means that the semiconductor material in this region is, on the whole, n-conductive. The n-conductive region preferably has a width of 5 µm to 20 µm. The term "width" is understood to mean the extension in the direction in parallel with the first main surface of the carrier substrate.

The carrier substrate of the optoelectronic component is preferably a silicon substrate or a germanium substrate. A carrier substrate consisting of a semiconductor material is advantageous with respect to a carrier substrate consisting of, e.g., ceramic material in that it can be processed comparatively simply and cost-effectively using standardized semiconductor processes. In particular, formation of the surface doping zone means that the protective diode for the semiconductor body can be produced for a small manufacturing outlay.

The thickness of the carrier substrate is preferably 100 µm to 150 µm.

The surface doping zone preferably has a depth of 0.5 µm to 4 µm. The surface doping zone thus extends from the first main surface of the carrier substrate 0.5 µm to 4 µm into the carrier substrate. The depth of the surface doping zone is thus advantageously substantially less than the thickness of the carrier substrate.

The surface doping zone preferably has a concentration of free charge carriers of more than $10^{18}$ cm$^{-3}$. In particular, the concentration of free charge carriers can be $10^{18}$ cm$^{-3}$ to $10^{21}$ cm$^{-3}$.

Outside the surface doping zone, the carrier substrate preferably has a concentration of free charge carriers of less than $10^{16}$ cm$^{-3}$. In particular, an undoped semiconductor substrate, in particular an undoped silicon substrate or germanium substrate, is used as the carrier substrate.

The specific resistance of the carrier substrate outside the surface doping zone is preferably more than 200 Ωcm.

Owing to the low charge carrier concentration and the comparatively high specific resistance caused thereby of the carrier substrate outside the surface doping zone, the carrier substrate acts outside the surface doping zone as an electrical insulator. This has the advantage that the carrier substrate can comprise uncoated lateral flanks. In particular, the lateral flanks of the carrier substrate do not have to be passivated with an electrically insulating layer. This would be required in the case of a carrier substrate consisting of an electrically conductive material since otherwise there would be the risk of an electrical short-circuit on the lateral flanks of the carrier substrate. The risk of a short-circuit is particularly present when the through-connections on the second main surface of the carrier substrate connect to, e.g., the conductor tracks of a printed circuit board by a solder connection. In this case, it would be possible during the soldering process for the solder to rise up to the lateral flanks of the carrier substrate which means that, in the case of a carrier substrate consisting of an electrically conductive material, a short-circuit could arise. This risk is advantageously reduced by virtue of the fact that the carrier substrate is advantageously undoped outside the surface doping zone and thus has a low specific resistance of preferably more than 200 Ωcm and a low charge carrier concentration of preferably less than $10^{16}$ cm$^{-3}$. When applying a voltage of 4V to the rear-side contacts of the carrier substrate formed by the through-connections, leakage current is preferably less than 1 µA.

Preferably, the n-conductive region, as seen in a plan view of the first main surface of the carrier substrate, is disposed as a ring around the first through-connection. In this case, the n-conductive region is thus formed in a cylindrical manner, wherein the height of the cylinder corresponds to the depth of the surface doping zone, preferably 0.5 µm to 4.0 µm and the wall thickness of the cylinder corresponds to the width of the n-conductive region, preferably 5 µm to 20 µm.

Advantageously, the p-conductive region contains a p$^+$-conductive region, wherein the "p$^+$-conductive region" is understood to mean a p-conductive region having a higher concentration of the p-dopant than the remaining p-conductive region. The dopant concentration in the p$^+$-conductive region is preferably at least $1*10^{20}$ cm$^{-3}$.

The second sub-region of the solder layer may connect in the p$^+$-conductive region to the p-conductive region. For example, the second sub-region of the solder layer can connect to the p$^+$-conductive region by contact metallization, wherein the remaining p-conductive region is separated from the solder layer by an electrically insulating layer. The high dopant concentration in the p$^+$-conductive region ensures that a low contact resistance is advantageously achieved at the boundary surface between the semiconductor material and the contact metallization.

The first sub-region of the solder layer preferably connects to the n-conductive region by a further contact metallization and is electrically insulated from the remaining surface doping zone by an electrically insulating layer.

The $p^+$-conductive region, as seen in a plan view on the first main surface of the carrier substrate, is preferably disposed as a ring around the first through-connection, and preferably such that the annular $p^+$-conductive region has a larger radius that the annular n-conductive region. The annular $p^+$-conductive region is thus disposed outside the annular n-conductive region.

The annular n-conductive region and the annular $p^+$-conductive region can have part of the remaining p-conductive region disposed therebetween. The pn-junction, which forms the protective diode, is thus disposed on the outer surface of the annular n-conductive region. The annular design of the n-conductive region is advantageous in that a pn-junction having a comparatively large surface can be produced for a small manufacturing outlay. The protective diode produced in this manner thus has high ampacity.

My component will be explained in more detail hereinafter with the aid of an example in conjunction with FIGS. 1 to 3. The parts illustrated in the figures and the size ratios of the parts with respect to each other are not to be regarded as being to scale.

The example illustrated in FIG. 1 of an optoelectronic component is an LED. The LED comprises a semiconductor body 1 comprising an epitaxial layer sequence 2 having an active layer 4 suitable for radiation emission. The epitaxial layer sequence can be based, for example, on a nitride compound semiconductor material. The phrase "based on a nitride compound semiconductor" is understood to mean that the semiconductor layer sequence or at least a layer thereof includes a III-nitride compound semiconductor material, preferably $In_xAl_yGa_{1-x-y}N$, wherein $0 \leq x \leq 1$, $0 \leq y \leq 1$ and $x+y \leq 1$. This material does not imperatively have to have a mathematically precise composition in accordance with the above formula. Rather, it can comprise one or more dopants as well as additional constituents which do not substantially change the characteristic physical properties of the $In_xAl_yGa_{1-x-y}N$ material. However, for the sake of simplicity, the above formula only contains the essential constituents of the crystal lattice (In, Al, Ga, N) even though these can be partially replaced by small amounts of other substances.

The active layer 4 can comprise, for example, a pn-junction or a single or multiple quantum well structure for radiation emission. The active layer 4 is disposed between a p-doped semiconductor region 3 and an n-doped semiconductor region 5. The lateral flanks of the semiconductor body 1 are advantageously provided with an insulating layer 13.

The semiconductor body 1 can be roughened or provided with structuring 17 on its radiation exit surface 22 to improve the coupling-out of radiation from the semiconductor body 1. The structuring or roughening of the semiconductor body 1 on the radiation exit surface 22 can be effected in particular by an etching process.

The LED in accordance with the example is a so-called "thin-film" LED, of which a growth substrate, used for growing the epitaxial layer sequence 2, was subsequently removed from the epitaxial layer sequence 2. The original growth substrate was removed from that side of the semiconductor body 1 on which the radiation exit surface 22 is now located.

On a surface opposite the radiation exit surface 22, the semiconductor body 1 connects to a carrier substrate 6 by a solder layer 7. The semiconductor body 1 connects to the carrier substrate 6 during production of the component preferably before the original growth substrate is removed from the surface of the semiconductor body 1 now being used as the radiation exit surface 22. Since the carrier substrate 6 does not have to be suitable for the epitaxial growth of the epitaxial layer sequence 2, in contrast to the growth substrate, there is a comparatively large degree of freedom in selecting the material for the carrier substrate 6. In particular, a carrier substrate 6 can be selected which is characterized by comparatively low costs and/or good thermal conductivity.

The solder layer 7 is preferably formed from a metal or a metal alloy which can contain in particular Au, Sn or AuSn.

The carrier substrate 6 comprises a first main surface 11 facing the semiconductor body 1 and a second main surface 12 facing away from the semiconductor body. The carrier substrate 6 comprises a first through-connection 9a and a second through-connection 9b each of which extend from the first main surface 11 to the second main surface 12 of the carrier substrate 6. The through-connections 9a, 9b can contain, for example, Ag, Au or CuW.

The carrier substrate 6 is formed from a semiconductor material. In particular, the carrier substrate 6 can be a silicon substrate or a germanium substrate. The use of a carrier substrate 6 consisting of a semiconductor material such as, e.g., silicon is advantageous in that the carrier substrate 6 is comparatively cost-effective and can be processed in a comparatively simple manner using standardized semiconductor processes.

The first main surface 11 and the second main surface 12 of the carrier substrate 6, except for the through-connections 9a, 9b, are provided with an electrically insulating layer 13 to avoid short-circuits in the optoelectronic component. The inner walls of the through-connections 9a, 9b are also each provided with the electrically insulating layer 13 to insulate the semiconductor material of the carrier substrate 6 from the through-connections 9a, 9b.

The electrically conductive through-connections 9a, 9b can be produced in the carrier substrate 6, for example, such that a liquid metal or a liquid metal alloy is pressed into openings in the carrier substrate 6 (liquid solder fill).

The two through-connections 9a, 9b are used for the electrical contacting of the semiconductor body 1. For example, the first through-connection 9a connects to the p-doped semiconductor region 3 of the epitaxial layer sequence 2 in an electrically conductive manner and the second through-connection 9b connects to the n-doped semiconductor region 5 in an electrically conductive manner.

An electrically conductive connection between the first through-connection 9a and the p-doped region 3 of the epitaxial layer sequence 2 can be produced by the solder layer 7 disposed between the semiconductor body 1 and the carrier substrate 6. In particular, the first through-connection 9a is adjacent to a first sub-region 7a of the solder layer 7 electrically connected to the p-doped semiconductor region 3. The p-doped semiconductor region 3 does not necessarily have to be directly adjacent to the solder layer 7 as illustrated in FIG. 1. Rather, further layers can be disposed between the p-doped semiconductor region 3 and the solder layer 7, in particular a reflective layer (not shown) which deflects radiation, emitted from the active layer 4 towards the carrier substrate, to the radiation exit surface 22. In addition to the reflective layer, still further layers can be disposed between the p-doped semiconductor region 3 and the solder layer 7, e.g., barrier layers, wetting layers or adhesion-promoting layers which, for example, prevent diffusion of the solder material of the solder layer 7 into the reflective layer or improve the wetting of the semiconductor body 1 with the solder material.

The second through-connection 9b advantageously connects to the n-doped semiconductor region 5 in an electrically conductive manner. This can be effected, for example, such that a second sub-region 7b of the solder layer 7 is insulated from the remaining solder layer 7 and from the p-doped semiconductor region 3 by insulation layers 23. A through-going contact 15 extends from the sub-region 7b of the solder layer 7 through an opening through the epitaxial layer sequence 2 into the n-doped semiconductor region 5. The through-going contact 15 is insulated from the p-doped semiconductor region 3 and the active layer 4 by an insulating layer 23.

Contacting the optoelectronic component by a through-going contact 15 extending through the active zone 4 is advantageous in that contacting of the n-doped semiconductor region 5 and also of the p-doped semiconductor region 3 is effected from the side of the semiconductor body 1 facing the carrier substrate 6. The radiation exit surface 22 of the optoelectronic component is thus advantageously free of electrical contact elements such as, e.g., bond pads, contact metallizations or connecting wires. In this manner, absorption of radiation by contact elements on the radiation exit surface 22 is prevented.

The through-connections 9a, 9b can advantageously connect from the outside to the second main surface 12 of the carrier substrate 6 opposite the semiconductor body 1. In particular, the electrically conductive through-connections 9a, 9b on the second main surface of the carrier substrate 6 can connect, for example, to the conductor tracks 19 of a printed circuit board 18. The through-connections 9a, 9b can be provided, for example, on the second main surface 12 of the carrier substrate 6 in each case with a metallizing layer 21, e.g., a nickel layer, connected in each case to the conductor tracks 19 of the printed circuit board 18 by a solder layer 20. The optoelectronic component can thus be surface-mounted in an advantageous manner.

A first surface doping zone 14 is formed on the first main surface 11 of the carrier substrate 6. The surface doping zone 14 extends along the entire first main surface 11 of the carrier substrate 6 with the exception of the through-connections 9a, 9b. The surface doping zone 14 comprises a p-conductive region 14a which contains a p-dopant. An n-conductive region 14b is adjacent to the p-conductive region 14a which means that a pn-junction 16 is formed between the p-conductive region 14a and the n-conductive region 14b.

Figure 2:
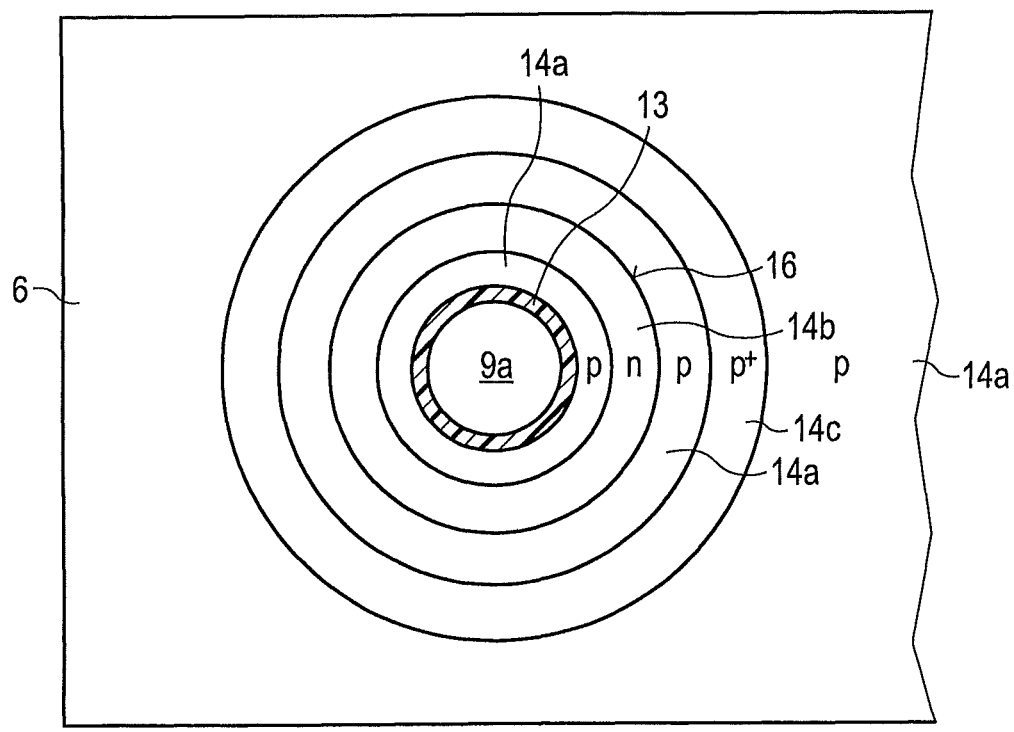
FIG. 2 shows a schematic illustration of a plan view of a sub-region of the first main surface of the carrier substrate in the region of the first through-connection in the example.
Figure 3:
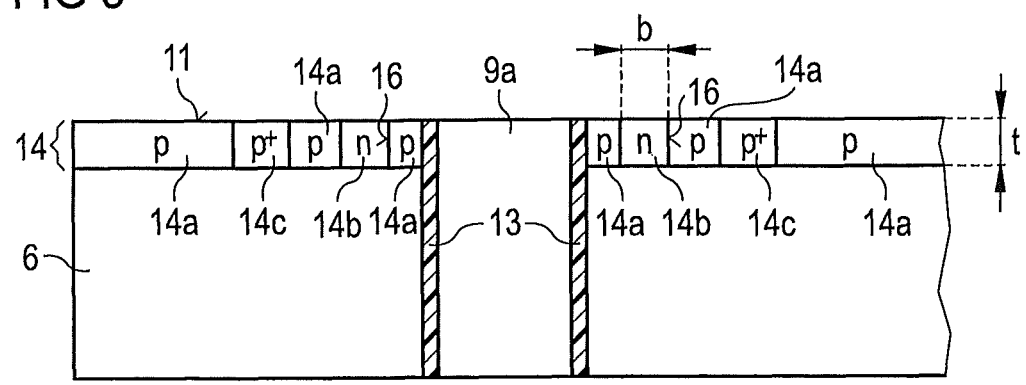
FIG. 3 shows a schematic illustration of a cross-section through the sub-region of the carrier substrate illustrated in the plan view of FIG. 2.

As can be seen in the plan view in FIG. 2, the n-conductive region 14b is disposed as a ring around the first through-connection 9a. The annular design of the n-conductive region 14b in the surface doping zone 14 is advantageous in that the pn-junction 16 has a comparatively large surface and thus high ampacity in the reverse direction of the optoelectronic component.

The p-conductive region 14a of the surface doping zone 14 preferably contains a sub-region 14c having a higher concentration of p-dopant than the remaining p-conductive region 14a. This sub-region 14c is referred to hereinafter as "p$^+$-conductive region" 14c. The p$^+$-conductive region 14c can be disposed, like the n-conductive region 14b, as a ring around the first through-connection 9a. The annular p$^+$-conductive region 14c is preferably disposed outside the annular n-conductive region 14b.

As shown in FIG. 1, the n-conductive region 14b connects to the first sub-region of the solder layer 7a by contact metallization 8a. In this manner, the n-conductive region 14b connects to the p-doped semiconductor region 3 of the epitaxial layer sequence 2 in an electrically conductive manner. The p$^+$-conductive region 14c connects to the second sub-region 7b of the solder layer 7 by further contact metallization 8b. In this manner, the p$^+$-conductive region 14c connects to the n-doped semiconductor region 5 of the epitaxial layer sequence 2 in an electrically conductive manner. In the regions of the contact metallizations 8a, 8b, the electrically insulating layer 13, which insulates the carrier substrate 6 from the solder layer 7 outside the through-connections 9a, 9b, is interrupted.

By virtue of the fact that the p$^+$-conductive region 14c connects to the n-doped region 5 of the epitaxial layer sequence 2 via the second sub-region 7b of the solder layer and the through-going contact 15, and the n-conductive region 14b connects to the p-doped semiconductor region 3 of the epitaxial layer sequence 2 via the first sub-region 7a of the solder layer, the pn-junction 16 of the doping zone 14 connects anti-parallel to the active layer 4 of the optoelectronic component. The pn-junction 16 formed by the doping zone 14 in the carrier substrate 6 is thus polarized in the forward direction when a voltage is applied to the through-connections 9a, 9b, which voltage is polarized in the reverse direction of the active layer 4 of the optoelectronic component. The doping zone 14 thus advantageously forms an ESD-protective diode for the optoelectronic component.

The surface doping zone 14 can be manufactured in particular by virtue of the fact that in a first step a p-dopant is implanted or diffused into the carrier substrate 6 throughout the entire first main surface 11. The surface doping zone 14 advantageously has a depth t of 0.5 μm to 4 μm. The thickness of the carrier substrate 6 is preferably 100 μm to 150 μm. The surface doping zone is thus advantageously formed only in a comparatively small region of the carrier substrate 6 close to the surface.

Outside the surface doping zone 14, the carrier substrate 6 advantageously has a concentration of free charge carriers of less than $10^{16}$ cm$^{-3}$. The specific resistance outside the surface doping zone is preferably more than 200 Ωcm. The carrier substrate 6 is thus an effective electrical insulator outside the surface doping zone 14. This is advantageous in that the lateral flanks 10 of the carrier substrate 6 do not have to be provided with an electrically insulating passivation layer to prevent short-circuits on the lateral flanks 10. Such short-circuits could occur, for example, if the material of the solder layer 20 which connects the carrier substrate 6 to the printed circuit board 18 came into contact with the lateral flanks of an electrically conductive carrier substrate 6. Owing the electrically insulating properties of the carrier substrate 6, the lateral flanks 10 can advantageously remain uncoated.

In the surface doping zone 14, the concentration of free charge carriers is preferably at least $10^{18}$ cm$^{-3}$, in particular $10^{18}$ cm$^{-3}$ to $10^{21}$ cm$^{-3}$.

The n-conductive region 14b is advantageously produced by virtue of the fact that an n-dopant is implanted or diffused into a sub-region of the carrier substrate 6 which has been previously p-doped over the entire surface. The n-dopant can be implanted or diffused, for example, by a mask having an annular opening so that an annular n-conductive region 14b is produced, as shown in FIG. 2. The concentration of the n-dopant in the n-conductive region 14b is selected such that it is higher than the concentration of the previously implanted or diffused p-dopant. The n-conductive region 14b thus comprises a p-dopant as well as an n-dopant, wherein the concentration of the n-dopant is higher than that of the p-dopant which means that the semiconductor material in the n-conductive region 14b is, on the whole, n-conductive.

In a similar manner to the n-conductive region 14b, the p+-conductive region 14c can be produced in the p-conductive region 14a by a mask having an annular opening. Further p-dopant is implanted into the p+-conductive region 14c through the annular opening so that the p+-conductive region has a higher concentration of p-dopant than the remaining p-conductive region 14a.

The n-conductive region 14b and/or the p+-conductive region 14c preferably have in each case a width b of 5 μm to 20 μm. A likewise annular sub-region of the p-conductive region 14a can be disposed between the n-conductive region 14b and the p+-conductive region 14c and preferably likewise has a width of 5 μm to 20 μm.

My components are not limited by the description using the examples. Rather, this disclosure includes any new feature and any combination of features included in particular in any combination of features in the appended claims, even if the feature or combination itself is not explicitly stated in the claims or examples.

The invention claimed is:

1. An optoelectronic component having a semiconductor body comprising an epitaxial layer sequence having an active layer that generates radiation, and a carrier substrate consisting of a semiconductor material connected to the semiconductor body by a solder layer,
wherein
the carrier substrate comprises a first through-connection and a second through-connection each of which extend from a first main surface of the carrier substrate facing the semiconductor body to a second main surface of the carrier substrate facing away from the semiconductor body,
the epitaxial layer sequence comprises a p-doped semiconductor region and an n-doped semiconductor region, wherein the first through-connection connects in an electrically conductive manner to the p-doped semiconductor region via a first sub-region of the solder layer, and the second through-connection connects in an electrically conductive manner to the n-doped semiconductor region via a second sub-region of the solder layer,
the carrier substrate comprises a surface doping zone which extends along the first main surface,
the surface doping zone comprises a p-conductive region which contains a p-dopant,
the surface doping zone comprises an n-conductive region adjacent to the p-conductive region and contains an n-dopant and a p-dopant so that a pn-junction is formed between the p-conductive region and the n-conductive region,
the n-conductive region electrically connects to the first sub-region of the solder layer and the p-conductive region electrically connects to the second sub-region of the solder layer so that the pn-junction in the surface doping zone forms a protective diode for the semiconductor body,
the p-conductive region contains a p+-conductive region having a higher concentration of p-dopant than a remaining p-conductive region, and
the p+-conductive region is disposed as a ring around the first through-connection.

2. The optoelectronic component according to claim 1, wherein the surface doping zone extends along the entire first main surface of the carrier substrate with the exception of the through-connections.

3. The optoelectronic component according to claim 1, wherein the n-conductive region has a width of 5 μm to 20 μm.

4. The optoelectronic component according to claim 1, wherein the n-conductive region is disposed as a ring around the first through-connection.

5. The optoelectronic component according to claim 1, wherein the second sub-region of the solder layer connects in the p+-conductive region to the p-conductive region.

6. The optoelectronic component according to claim 1, wherein the annular n-conductive region and the annular p+-conductive region have part of the p-conductive region disposed therebetween.

7. An optoelectronic component having a semiconductor body comprising an epitaxial layer sequence having an active layer that generates radiation, and a carrier substrate consisting of a semiconductor material connected to the semiconductor body by a solder layer,
wherein,
the carrier substrate comprises a first through-connection and a second through-connection each of which extend from a first main surface of the carrier substrate facing the semiconductor body to a second main surface of the carrier substrate facing away from the semiconductor body,
the epitaxial layer sequence comprises a p-doped semiconductor region and an n-doped semiconductor region, wherein the first through-connection connects in an electrically conductive manner to the p-doped semiconductor region via a first sub-region of the solder layer, and the second through-connection connects in an electrically conductive manner to the n-doped semiconductor region via a second sub-region of the solder layer,
the carrier substrate comprises a surface doping zone extending along the first main surface,
the surface doping zone comprises a p-conductive region which contains a p-dopant,
the surface doping zone comprises an n-conductive region adjacent to the p-conductive region and contains an n-dopant and a p-dopant so that a pn-junction is formed between the p-conductive region and the n-conductive region,
the n-conductive region is disposed as a ring around the first through-connection,
the n-conductive region electrically connects to the first sub-region of the solder layer and the p-conductive region electrically connects to the second sub-region of the solder layer so that the pn-j unction in the surface doping zone forms a protective diode for the semiconductor body.

8. The optoelectronic component according to claim 7, wherein the carrier substrate is a silicon substrate or a germanium substrate.

9. The optoelectronic component according to claim 7, wherein the carrier substrate has a thickness of 100 μm to 150 μm.

10. The optoelectronic component according to claim 7, wherein the surface doping zone has a depth of 0.5 μm to 4 μm.

11. The optoelectronic component according to claim 7, wherein the surface doping zone has a concentration of free charge carriers of more than $10^{18}$ cm$^{-3}$.

12. The optoelectronic component according to claim 7, wherein outside the surface doping zone, the carrier substrate has a concentration of free charge carriers of less than $10^{16}$ cm$^{-3}$.

13. The optoelectronic component according to claim 7, wherein outside the surface doping zone, the carrier substrate has a specific resistance of more than 200 Ωcm.

14. The optoelectronic component according to claim 7, wherein the carrier substrate comprises uncoated lateral flanks.

15. The optoelectronic component according to claim 7, wherein the p-conductive region contains a $p^+$-conductive region having a higher concentration of p-dopant than the remaining p-conductive region.

16. The optoelectronic component according to claim 15, wherein the second sub-region of the solder layer connects in the $p^+$-conductive region to the p-conductive region.

17. The optoelectronic component according to claim 15, wherein the $p^+$-conductive region is disposed as a ring around the first through-connection.

18. The optoelectronic component according to claim 17, wherein the annular n-conductive region and the annular $p^+$-conductive region have part of the p-conductive region disposed therebetween.

19. The optoelectronic component according to claim 7, wherein the surface doping zone extends along the entire first main surface of the carrier substrate with the exception of the through-connections.

20. The optoelectronic component according to claim 7, wherein the n-conductive region has a width of 5 μm to 20 μm.

* * * * *